(12) United States Patent
Mellitz

(10) Patent No.: US 6,624,690 B2
(45) Date of Patent: *Sep. 23, 2003

(54) METHOD AND APPARATUS TO DELAY CIRCUIT TRIGGER

(75) Inventor: Richard I. Mellitz, Irmo, SC (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/449,284

(22) Filed: Nov. 24, 1999

(65) Prior Publication Data

US 2002/0033719 A1 Mar. 21, 2002

(51) Int. Cl.[7] ................................................. H01L 25/00
(52) U.S. Cl. ........................................ 327/564; 327/565
(58) Field of Search .......................... 327/355, 564–566

(56) References Cited

U.S. PATENT DOCUMENTS

| | | | | |
|---|---|---|---|---|
| 5,125,009 A | * | 6/1992 | DeVilbiss | .................... 375/107 |
| 5,532,500 A | * | 7/1996 | Okamura et al. | ............ 257/207 |
| 6,065,129 A | * | 5/2000 | Sakamoto et al. | .......... 713/500 |

* cited by examiner

*Primary Examiner*—Kenneth B. Wells
(74) *Attorney, Agent, or Firm*—Blakely, Sokoloff, Taylor & Zafman LLP

(57) ABSTRACT

An apparatus includes a circuit and a signal source to supply a trigger signal to the circuit. The signal source is adapted to supply the trigger signal such that a reflection of the trigger signal delays the time at which the circuit is triggered.

14 Claims, 3 Drawing Sheets

METHOD AND APPARATUS TO DELAY CIRCUIT TRIGGER

BACKGROUND

1. Field

The invention relates to the field of electrical signals and more particularly, to the reflection of electrical signals along a circuit path.

2. Background Information

Electrical circuits often have their operation driven by a signal which is known as a "clock" signal (which may also be called a "trigger" signal). The trigger signal typically takes the form of a pulse which rises from a first predetermined voltage level (typically called "low") to a second predetermined voltage level (typically called "high"). Of course, the designation of which voltage level constitutes a "low" or "high" is merely a matter of convention. Circuits which receive a trigger signal typically have their operation triggered when the trigger signal crosses a "trigger" level. The trigger level is a voltage level between the first predetermined level and the second predetermined level. As the voltage of the trigger signal rises between these levels, it crosses the trigger level with the result that the circuit receiving the trigger signal may perform an operation. For example, the well known latching circuit may read in and store a signal on a data input terminal where the trigger signal crosses the trigger level. When this occurs, the latch circuit is said to have been "triggered" or "clocked". Of course, a circuit's operation may also be triggered by the transition of the trigger signal from the higher predetermined voltage level to the lower predetermined voltage level. The transition of a trigger signal from low to high voltage levels may be referred to as a "rising" edge of a trigger signal. Likewise, the transition from high to low voltage levels of a trigger signal may be referred to as the "falling" edge.

Some circuits are capable of performing multiple operations, with some operations triggered on a rising edge and others triggered on the falling edge of a trigger signal. For example, a memory circuit may write (e.g. store) signals on its data input terminals and may read (e.g. output) signals stored in the memory to its data output terminals. The memory write operation may be triggered on the rising edge of a trigger signal and the memory read operation may be triggered on the falling edge of the trigger signal. Some memory circuits may be capable of performing a write operation and a read operation each triggered by the rising and falling edges of the same trigger signal.

In some situations it may be desirable to substantially delay the triggering of the operation on the rising edge, without causing substantial delay to the triggering of the operation on the falling edge, or vice versa. For example, it may be desirable to delay the triggering of a memory write operation on the rising edge of a clock pulse, without delaying the triggering of a memory read operation on the falling edge of the same trigger signal. This may be desirable when the signals on the data input terminals are not available at the point in time when the rising edge of the trigger signal triggers a memory write operation. The circuits which read data signals from the data output terminals of the memory may be configured to receive the data signals shortly after the same trigger signal triggers a memory read operation. Thus it may not be acceptable to simply delay the entire trigger signal to delay the rising edge, because by delaying the entire trigger signal, both the rising and falling edges are delayed, which interferes with the memory read operation. The circuit reading data signals from the memory would be forced to incur delays to accommodate the delays in the memory write operation.

One solution to this problem is to narrow the trigger signal so that the falling edge occurs sooner after the rising edge. By narrowing the trigger signal, the time at which the rising edge occurs may be delayed without altering the time in which the falling edge occurs. This approach may not be feasible in applications where the trigger signal is distributed to multiple circuits, some of which are adapted to expect the rising edge to occur at a predetermined point in time and at least one circuit adapted to expect the rising edge to be delayed. In this situation, simply adapting the trigger signal generator to produce a narrower trigger signal may be undesirable because the operation of some of the circuits receiving the trigger signal may be adversely affected. Those skilled in the art will recognize that the same situation could arise in situations where the timing of the rising edge is to be left unchanged, but where the falling edge needs to occur sooner in time.

Thus, there exists a continuing need for a mechanism by which the timing of one edge of a signal received by circuit may be adjusted without substantially changing the timing of the other edge of the signal, and without altering the timing of the signal edges to other circuits which receive the signal.

SUMMARY

An apparatus includes a circuit and a signal source to supply a trigger signal to the circuit. The signal source is adapted to supply the trigger signal such that a reflection of the trigger signal delays the time at which the circuit is triggered.

BRIEF DESCRIPTION OF THE DRAWINGS

The subject matter regarded as the invention is particularly pointed out and distinctly claimed in the concluding portion of the specification. The invention, however, may be further understood by reference to the following detailed description read with reference to the accompanying drawings.

DETAILED DESCRIPTION

In one embodiment of the present invention an incident trigger signal and a reflected trigger signal are superimposed to form a composite trigger signal. Relative to the incident trigger signal, the rising edge of the composite trigger signal is delayed without creating substantial delay in the falling edge of the composite trigger signal. The following description and drawings describe the present invention in terms of specific embodiments and examples, however, the scope of the present invention is defined only by the amended claims.

Figure 1:
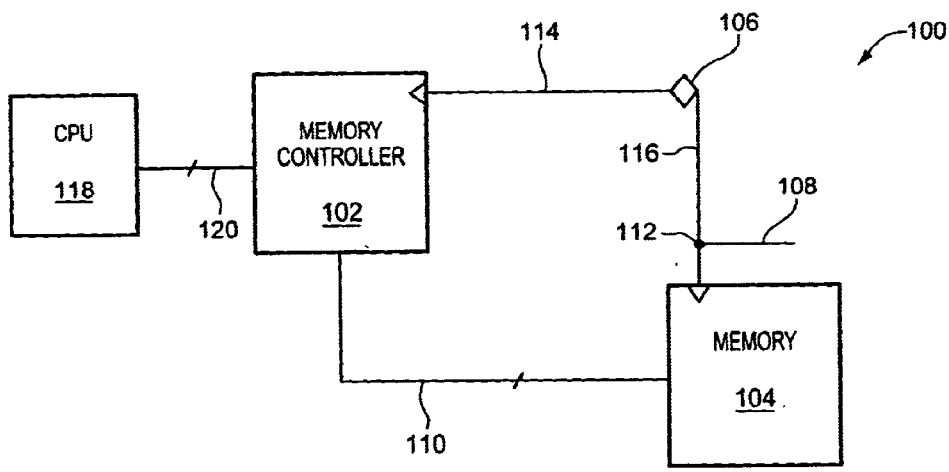
FIG. 1 shows a system in accordance with one embodiment of the present invention.

FIG. 1 shows a system in accordance with one embodiment 100 of the present invention. The system comprises a processor 118, a memory controller 102, and a memory 104. The processor 118 and memory controller 102 are coupled by way of processor bus 120. Memory controller 102 and memory 104 are coupled by way of memory bus 110. Processor 118 may write data to memory by placing data signals on processor bus 120. Memory controller 102 may transfer these data signals to memory bus 110, from which they may be received into memory 104, e.g. written to memory 104. Processor 118 may read data signals from memory 104 by indicating to memory controller 102 an address in the memory 104 from which to read data signals. Memory controller 102 may signal memory 104 to place data signals from this address on memory bus 110. Memory controller 102 may transfer the data signals from memory bus 110 to processor bus 120.

Embodiment 100 further comprises trigger signal generator 106 to generate synchronized trigger signals to memory controller 102 and memory 104. Trigger signals serve to synchronize the operation of memory controller 102 and memory 104. This is commonly referred to as a common clock circuit configuration. Trigger signals propagate from signal generator 106 to memory controller 102 over signal path 114. Trigger signals propagate from signal generator 106 to memory 104 over signal path 116. The trigger signal generated by signal generator 106 is referred to as the incident trigger signal. In accordance with one embodiment of the present invention, a junction 112 is formed on signal path 116 and signal path 108 is joined thereto. Signal path 108 will henceforth be referred to as stub path.

Figure 2:
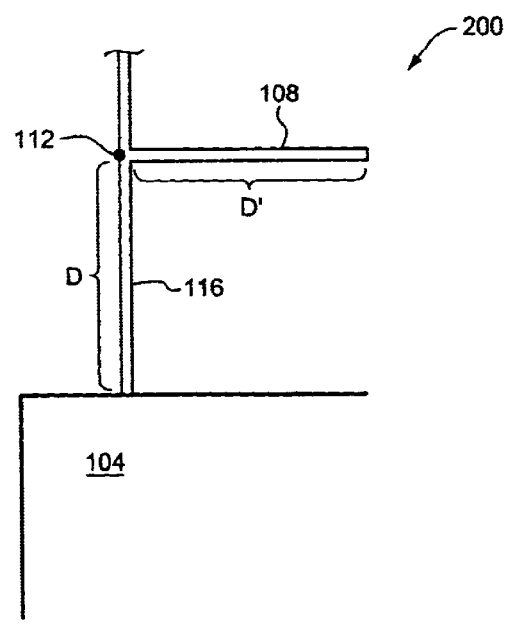
FIG. 2 shows an embodiment of stud path in accordance with the present invention.

FIG. 2 shows an embodiment 200 of stub path 108 in accordance with the present invention. In this embodiment junction 112 is a simple "T" connection of stub path 108 and signal path 116. Stub path is unterminated. That is, no resistive, capacitive, inductive, or other electrical load is coupled between stud path 108 and an electrical ground. Stub path 108 floats electrically and may be a strip of conductive material of length D' which is unterminated. Length D' may be chosen to be approximately the same as the length D of signal path 116 as is present between junction 112 and memory 104. Stub path length D' may not be exactly equal to the length D, and may in fact fall within some percentage of length D. For example, length D' may "of an order" of the length D. In some embodiments, stub path length D' may vary between approximately 5% and 50% of the length of signal path 116 between junction 112 and memory 104. Determination of stub length D is described further below.

Figure 3:
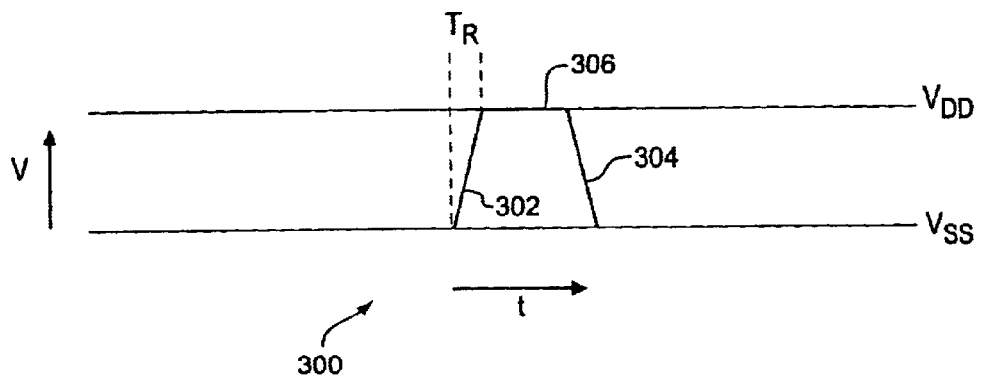
FIG. 3 illustrates an embodiment of an incident trigger signal in accordance with the present invention.

FIG. 3 illustrates an embodiment 300 of an incident trigger signal in accordance with the present invention. Trigger signal 300 is illustrated in accordance with metal oxide semi-conductor technology (CMOS), which comprises a well known predetermined low voltage level of Vss and a predetermined high voltage level of Vdd (source and drain voltages respectively for CMOS transistors). Of course, other semiconductor technologies are equally applicable to the present invention. Trigger signal 300 is illustrated in terms of its voltage level over time. Trigger signal 300 comprises a rising edge 302, a plateau 306, and a falling edge 304. Clock pulse 300 takes a certain period of time Tr to rise from low voltage Level Vss to the high voltage level Vdd. This period of time may be referred to as the rise time of the leading edge 302 of trigger signal 300.

Figure 4:
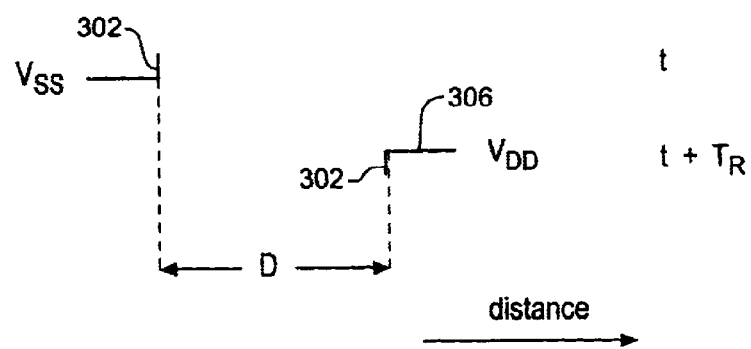
FIG. 4 is an illustration showing the trigger signal embodiment of FIG. 3 as it travels over a distance D.

FIG. 4 is an illustration showing the trigger signal embodiment of FIG. 3 as it travels over a distance D. Two distinct points in time are illustrated. At a first time t, the trigger signal 300 begins to rise from the low voltage Vss. At a later time t+Tr, the trigger signal 300 has reached plateau level 306. During the time it took trigger signal 300 to rise from the low voltage level to the high voltage level, e.g. the rise time Tr, the trigger signal may propagate a distance D down signal path 116. For example, a trigger signal with a 1 ns (one nanosecond) rise time may propagate approximately five inches down the signal path 116 during the rise time. This distance may be calculated by multiplying 1 ns by the speed of electrical signal propagation, which may vary according to the electrical properties of signal path 116 but which may, in some embodiments, approximate the well-known value of the speed of light. As previously described, the length D' of stub path 108 need only be "of an order" or D and not precisely equal to D.

Figure 5:
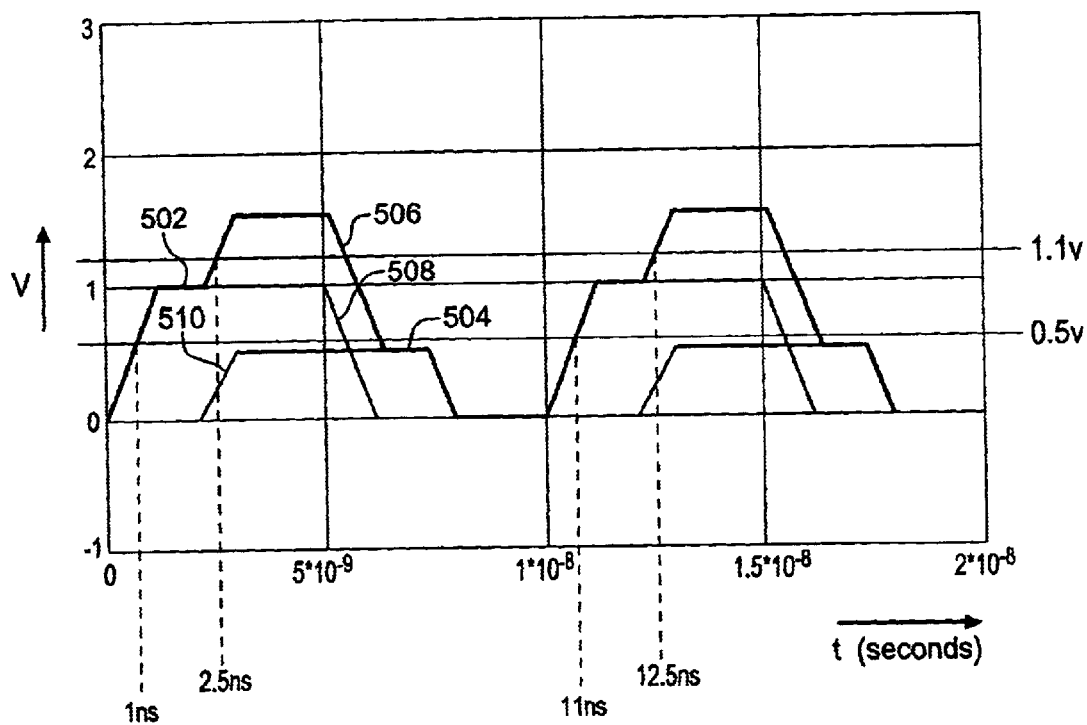
FIG. 5 shows an embodiment of a composite signal produced in accordance with the present invention.

FIG. 5 shows an embodiment of a composite signal produced in accordance with the present invention. Stub path 108 may reflect an incident trigger signal 508 to produce a reflection signal 510 on signal path 116. The length of stub path 108 is appropriately chosen as described previously. The rising and falling edges of reflection signal 510 may be offset from the rising and falling edges of the incident signal 508. Incident signal 508 and reflected signal 510 may superimpose over time to form a composite trigger signal 506. Composite signal 506 may have several advantageous properties. A plateau 502 may be formed in the rising edge of composite signal 510. Plateau 502 serves to delay the attainment of voltage levels above the plateau level 502. A plateau 504 may also be formed on falling edge of composite signal 506, however, plateau 504 of falling edge may occur at a voltage level substantially below plateau 502 of the rising edge. A circuit whose operation is driven by composite trigger signal 506 is adapted to be triggered at a voltage level above plateau level 502. Triggering of the circuit's operation may thus be delayed, due to the rising edge delay in reaching voltage levels above the plateau level 502.

For example, consider a memory circuit with a memory write operation triggered by the rising edge of incident signal 508 at a trigger level of 0.5 volts. According to the signal timings illustrated in FIG. 5, said circuit may be triggered for write operation at approximately 1 ns and 11 ns. Now consider a memory circuit with a write operation triggered at a 1.1V trigger level by composite signal 506. The write operation of such a circuit will be triggered at approximately 2.5 ns and 12.5 ns.

Now consider a memory circuit with a memory read operation triggered by the falling edge of incident signal 508 at a trigger level of 0.5 volts. According to the signal timings illustrated in FIG. 5, said circuit may be triggered for read operation at approximately 6 ns and 16 ns. Now consider a memory circuit adapted to trigger a read operation at trigger level of 1.1V by falling edge of composite signal 506. The read operation of such a circuit will again be triggered at approximately 6 ns and 16 ns. In other words, the read operation of the two memory circuits is triggered at approximately the same time. In other words, by applying composite trigger signal 506 to a circuit with appropriately adapted trigger levels, the trigger time of an operation on the rising edge of composite trigger signal 506 may be substantially delayed without affecting the trigger time of an operation triggered on the falling edge of composite trigger signal 506.

The invention is in no way limited to the use of stub paths to produce the composite signal 506. Any mechanism for producing a trigger signal with the properties of composite signal 506 may also be employed. One embodiment employs a stub path 108 to produce a reflection signal 510 to combine with an incident signal 508 produced by a signal generator 106. However, other embodiments could produce a signal with properties similar to those of composite signal 506 using an arrangement of transistors or other circuit components. Such embodiments could potentially employ reflection signals, but would not necessarily do so. From the perspective of the circuit being triggered by the composite signal 506, the source (e.g. the specific circuit arrangements and adaptations) which produce composite signal 506 is less important than the properties of composite signal 506 itself. Thus, the invention is not limited to a particular circuit arrangement acting as the source of the composite signal 506.

Returning to FIG. 1, a memory write operation triggered on the rising edge of a trigger signal could be substantially delayed by applying the present invention to signal path 116 and memory 104. This may provide memory controller 102 with substantial additional time to establish data signals on memory bus 110 before the write operation is triggered. Trigger signals on other signal paths, for example path 114, would not be affected. Furthermore, memory read operations triggered by the falling edge of the trigger signal would not be substantially delayed as a result of delaying the memory write operations. This may be advantageous in applications where more time is needed to set up the data on memory bus 110 for a write operation, without affecting the performance of a read operations, and without affecting the timing of trigger signals to other circuits supplied by signal generator 106.

Those skilled in the art will of course recognize that the present invention may also be applied to delay circuit operations triggered on the falling edge of a signal. In such a case, the trigger level of the circuit for both rising and falling edge operations would be adjusted below the level of the plateau on the falling edge of composite signal 506. Thus, operations triggered on the rising edge would not be substantially delayed, because they are triggered at levels less than the level of the rising edge plateau. Operations triggered on the falling edge might be substantially delayed because they are triggered at levels less than the level of the falling edge plateau.

While the invention has been described in terms of specific embodiments and examples, those skilled in the art will appreciate numerous modifications are possible which fall within the scope of the invention. The specific examples and embodiments described herein are presented for purposes of illustration only, and the scope of the present invention should be construed only in light of the claims which follow.

What is claimed is:

1. An apparatus comprising:

a circuit; and a signal source to supply a trigger signal to trigger the circuit, the signal source comprising a signal generator to produce an incident signal; and a reflection generator to produce a reflection signal in response to the incident signal, the reflection generator formed and coupled with the circuit and signal source in such a manner that the incident signal and the reflection signal combine to form a trigger signal to the circuit, the trigger signal formed such that attainment of a trigger voltage level of the circuit by the trigger signal is delayed.

2. The apparatus of claim 1 in which the reflection generator comprises an unterminated length of conductive material.

3. The apparatus of claim 2 in which the length of the conductive material is of an order of a distance to be traveled by the incident signal during a transition time of the incident signal between two predetermined voltage levels.

4. The apparatus of claim 1 in which the circuit is a memory circuit.

5. An apparatus comprising:

a circuit; and a signal source to supply a trigger signal to the circuit;

wherein the signal source is adapted to supply the trigger signal with a first plateau on a first edge of the trigger signal and a second plateau on a second edge of the trigger signal, and the circuit is adapted to be triggered at a voltage level of the trigger signal the attainment of which is delayed as a result of one of the first and second plateaus.

6. The apparatus of claim 5 wherein the signal source comprises:

a signal generator to produce an incident signal; and a signal path to produce a reflection signal in response to the incident signal, the incident signal and the reflection signal combining to produce the plateaus.

7. The apparatus of claim 6 in which the signal path comprises an unterminated length of conductive material.

8. The apparatus of claim 7 in which the length of the signal path is of an order of a distance to be traveled by the incident signal during a transition time of the incident signal between two predetermined voltage levels.

9. The apparatus of claim 2 in which the circuit is a memory circuit.

10. A method comprising:

providing a trigger signal;

adapting the trigger signal according to a reflection of the trigger signal, to delay the trigger of a circuit; and applying the trigger signal to the circuit.

11. The method of claim 10 further comprising:

generating the reflection by way of an unterminated length of conductive material coupled to a signal path for the trigger signal.

12. The method of claim 10 in which generating the reflection further comprises:

generating the reflection by way of an unterminated length of conductive material coupled to a signal path for the trigger signal, the length of conductive material having a length of an order of a distance to be traveled by the trigger signal during a transition time of the trigger signal between two predetermined voltage levels.

13. A system comprising:

a first circuit;

a second circuit; and a signal generator to provide a trigger signal to the first and second circuits, the signal source to produce an incident signal; and a reflection generator to produce a reflection signal in response to the incident signal, the reflection generator formed and coupled with the circuit and signal source in such a manner that the incident signal and the reflection signal combine to form a trigger signal to the second circuit, the trigger signal formed such that attainment of a trigger voltage level of the second circuit by the trigger signal is delayed.

14. The system of claim 13, the reflection generator further comprising:

a signal path to produce the reflection in response to the incident signal, the incident signal and the reflection combining to delay the time at which the second circuit is triggered.

* * * * *